United States Patent [19]

Kondou

[11] Patent Number: 5,534,823
[45] Date of Patent: Jul. 9, 1996

[54] PHASE LOCKED LOOP (PLL) CIRCUIT HAVING VARIABLE LOOP FILTER FOR SHORTENED LOCKING TIME

[75] Inventor: Toyoo Kondou, Yamagata, Japan

[73] Assignee: NEC Corporation, Tokyo, Japan

[21] Appl. No.: 394,635

[22] Filed: Feb. 27, 1995

[30] Foreign Application Priority Data

Feb. 28, 1994 [JP] Japan ..................... 6-030679

[51] Int. Cl.6 ............................ H03L 7/093; H03L 7/107; H03L 7/18
[52] U.S. Cl. ................................. 331/16; 331/1 A; 331/8; 331/17; 331/25; 327/105; 327/159; 455/260
[58] Field of Search ................... 331/1 A, 8, 16, 331/17, 18, 25; 327/105, 157, 159; 455/260

[56] References Cited

U.S. PATENT DOCUMENTS

| 5,347,233 | 9/1994 | Ishibashi et al. | 331/17 X |
| 5,384,550 | 1/1995 | Henely et al. | 331/17 |
| 5,389,899 | 2/1995 | Yahagi et al. | 331/17 x |
| 5,408,202 | 4/1995 | Shirazi et al. | 331/17 X |
| 5,420,545 | 5/1995 | Davis et al. | 331/17 |

FOREIGN PATENT DOCUMENTS

| 60-6731 | 1/1985 | Japan . |
| 62-92521 | 4/1987 | Japan . |
| 2-94710 | 4/1990 | Japan . |
| 3-191642 | 8/1991 | Japan . |

*Primary Examiner*—David Mis
*Attorney, Agent, or Firm*—Whitham, Curtis, Whitham & McGinn

[57] ABSTRACT

Disclosed herein is A-phase-locked-loop PLL circuit including a voltage controlled oscillator (VCD) controlled in oscillation frequency by a control voltage, a divider dividing in frequency an oscillation signal of the VCO by a frequency division ratio to produce a frequency-divided signal, a phase comparator producing a phase comparison signal indicative of a difference in phase between a reference signal and the frequency-divided signal, and a filter converting the phase comparison signal into the control voltage to be used for controlling the VCO. The oscillation frequency of the VCO is thereby changed from a current frequency by variation of the frequency-division ratio and locked to a new frequency after a locking period of time elapses. There is further provided a control circuit which changes a time constant of the filter circuit a plurality of times during the locking period of time, this control circuit operating in response to the output of the phase comparator.

11 Claims, 4 Drawing Sheets

PHASE LOCKED LOOP (PLL) CIRCUIT HAVING VARIABLE LOOP FILTER FOR SHORTENED LOCKING TIME

BACKGROUND OF THE INVENTION

The present invention relates to a Phase Locked Loop (PLL) circuit and, more particularly, to a PLL circuit employed in a frequency synthesizer tuning system.

For a purpose of the realization of the multichannel or the digital communication such as a cordless telephone and a portable communication equipment, a frequency synthesizer tuning system employing a PLL circuit is widely used. The PLL circuit operates to tune a system to a desired channel and hence is required to have a high response speed. The time needed to switch the current channel over to a new channel, i.e. frequency-locking time, is thereby shortened.

The PLL circuit includes a phase comparator and a loop filter to control the oscillation frequency of a voltage controlled oscillator (VCO) by comparing in phase a reference signal with a signal from a counter for dividing the oscillation signal of the VCO. The frequency-locking time thereby depends on the response speed of the PLL circuit. The transient response speed is determined by a loop gain, a natural angular frequency and a damping factor of the PLL circuit. Among these factors, the loop gain has the dominant input/output characteristic of the VCO and the phase comparator, and the damping factor mainly depends on a time constant of the loop filter.

When the loop filter comprises an active type filter having an operational amplifier, an input resistor and a feedback circuit, the natural angular frequency $\omega_n$ and the damping factor $\zeta$ are represented as follows:

$$\omega_n = \sqrt{\frac{(K\phi \cdot Kv)}{(C1 \cdot R1)}} \quad (1)$$

$$\zeta = \sqrt{\frac{(K\phi \cdot Kv)}{(C1 \cdot R1)}} \cdot \frac{C1 \cdot R2}{2} \quad (2)$$

$$\zeta = \omega_n \cdot \frac{C1 \cdot R1}{2} \quad (3)$$

where $K\phi$ and $Kv$ denote the phase comparator gain and the VCO conversion gain, respectively, and R1, C1 and R2 represent an input impedance, a feedback capacity and a resistance of the active filter. The damping factor depends on two time constants C1·R1 and C1·R2. In general, to make the frequency-locking time small, the damping factor $\zeta$ is set to approximately 0.7.

Referring to FIG. 7 showing an example of the transient response speed of a PLL circuit, when the damping factor $\zeta$ is set to be large, for example, 2.0, since the natural angular frequency $\omega_n$ is also large, the first transition rapidly occurs. Although the time to shift from the initial frequency fo1 to the set frequency fo2 is short, the compensation sensitivity with respect to a minute frequency deviation is low and hence the convergence time to obtain the final stable state is long, thereby taking a long locking time TL. Further, since the equivalent noise band width of the loop is large, the noise component in the high frequency of the VCO can not be sufficiently eliminated, the carrier/noise ratio (C/N ratio) is thus deteriorated.

When the damping factor $\zeta$ is small, for example, 0.3, the natural angular frequency $\omega_n$ is also small, the first transition delays and hence the time to shift from the initial frequency fo1 to the set frequency fo2 is long, thereby resulting in the long locking time TL. When the damping factor $\zeta$ is in the vicinity of 0.7, the time to shift from the initial frequency fo1 to the set frequency fo2 is moderate. However, the compensation sensitivity with respect to the frequency deviation is high, the convergence time to obtain the final stable state is hence short, realizing the minimum locking time TL.

Referring to FIG. 6, a conventional PLL circuit includes a synthesizer unit 1, an active type filter 2 as a loop filter which generates a voltage control signal VC in response to a control signal CP from the unit 1, and a VCO 3 for outputting an oscillation signal 0 in response to the voltage control signal VC. This signal 0 is used for tuning. The unit 1 has a phase comparator 11 for carrying out the phase comparison between a reference signal R and a frequency division signal F to output a phase error signal D, a charge pump circuit 12 for converting the phase error signal D into the control signal CP, and a frequency-divider 13 which receives the oscillation signal 0 and divides it by a frequency division ratio set therein to produce the frequency division signal F. The filter 2 includes an inverting operational amplifier A1, an input resistor R1, and a feedback circuit composed of a resistor R2 and a capacitor C1 which are connected in series between the input and output of the inverting amplifier A1.

The PLL circuit as shown in FIG. 6 operates to lock the frequency division signal F in phase with the reference signal R. Accordingly, the VCO 3 produces a signal 0 having a frequency fo which is equal to the frequency fr of the reference signal R multiplied by N, i.e., fo=N×fr, wherein N indicates the frequency-division ratio set into the divider 13. When the frequency division ratio N of the divider 13 is changed from the first frequency division ratio N1 to N2 in order to tune to another channel, the frequency of the frequency division signal F is varied accordingly. The phase comparator 11 thereby detects a difference in phase between the reference signal R and the varied frequency division signal F and produces the signal D indicative of that difference. This signal D causes the VCO to change the frequency of the oscillation signal 0 through the charge pump circuit 12 and the filter 2. As a result, the VCO 3 oscillates and produces the signal 0 having a oscillation frequency fo2 that is equal to N2 ×fr.

The respective values of the capacitor C1 and resistors R1 and R2 correspond to C1, R1 and R2 of the equation (2), respectively, and thus selected such that the damping factor $\zeta$ is in the vicinity of 0.7, as described above.

The frequency-locking time of the PLL circuit is, however, constant. The frequency-locking time is required to be further shortened for the multichannelization of a tuner.

To this end, a PLL circuit is disclosed in Japanese Patent Laid-open Publication No. Hei 2-94710 in which the reference signal frequency is raised only when the transient state (unlocked state) at the time of frequency switching and again lowered to the original frequency after the locking. Another PLL circuit is shown in Japanese Patent Laid-open Publication No. Sho 60-16731, Japanese Patent Laid-open Publication No. Sho 62-92521 and Japanese Patent Laid-open Publication No. Hei 3-191642, for the purpose of adopting the two-mode damping factor switching system in which the damping factor is switched by means of the charge pump circuit, the switches and others in accordance with the locked or unlocked state before and after the locking of the PLL in order to achieve both the optimization of the locking time.

Thus, although various types of PLL circuits are proposed, there are many performance degradation factors such as the unstable locking when the frequency switching or the malfunction due to the jittering and the adjustment is difficult. Moreover, it is impossible to reduce the locking time determined by an optimum value of the loop constant more than ever.

SUMMARY OF THE INVENTION

It is therefore an object of the present invention to provide an improved PLL circuit.

It is another object of the present invention to provide a PLL circuit having a shortened frequency-locking time with a stabilized operation.

A PLL circuit according to the present invention is characterized by being provided a control circuit which changes a time constant of a filter circuit a plurality of times during a locking period to thereby shorten the locking period of time.

In more detail, the filter circuit has a variable resistance circuit whose resistance value determines the time constant thereof. When the frequency-division ratio of a divider is changed, the control circuit causes the variable resistance circuit to have a small resistance value. The time constant is thereby made small, so that the frequency of an oscillation signal from VCO is changed quickly. When an overshoot or an undershoot occurs in frequency of the oscillation signal, the control circuit detects that by use of an output signal from a phase detector and then makes the resistance value of the variable resistance circuit large. Similar operations are performed each time the overshoot or undershoot occurs. As a result, the locking time is shortened.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 1:
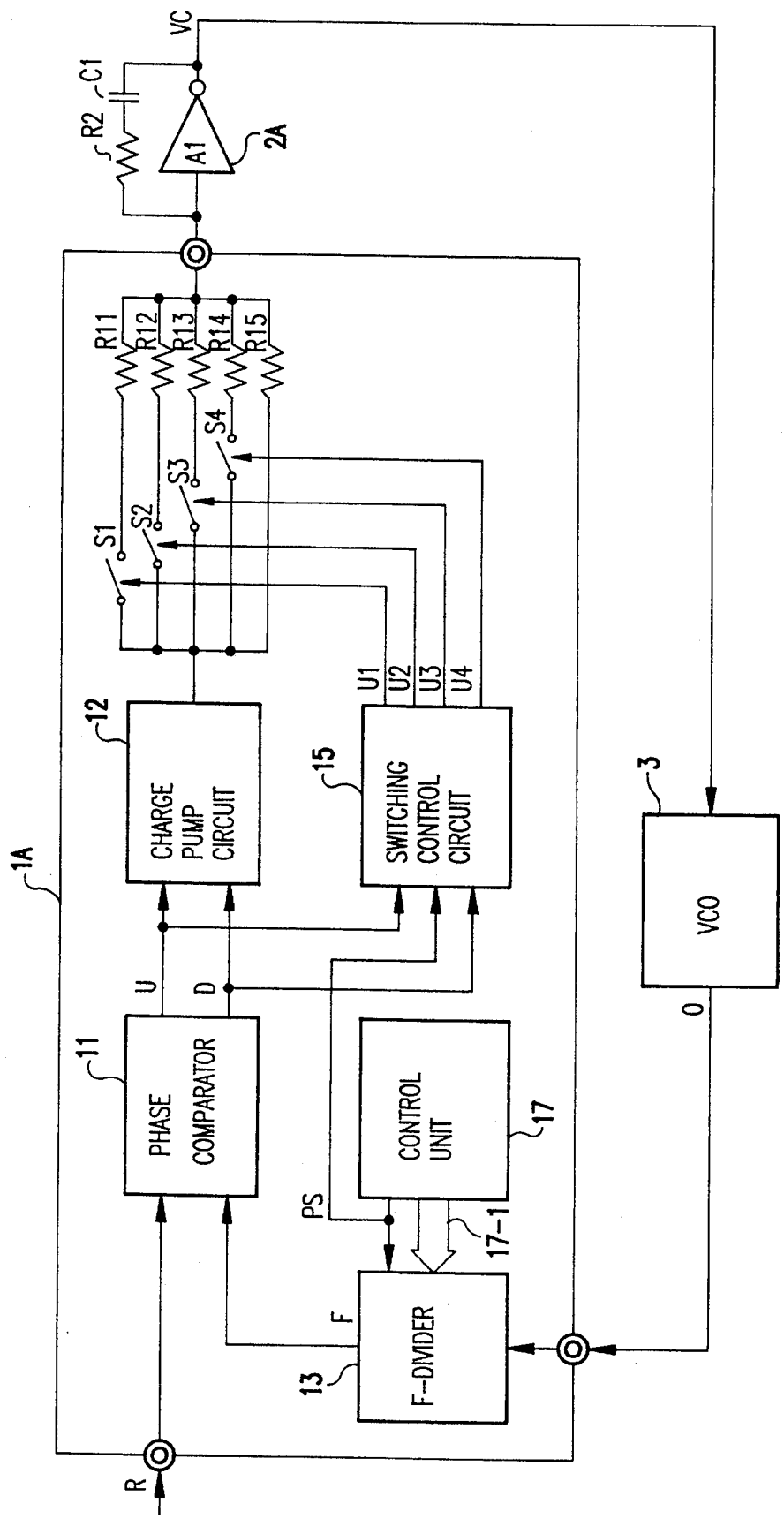
FIG. 1 is a block diagram showing a PLL circuit according to a first embodiment of the present invention.
Figure 6:
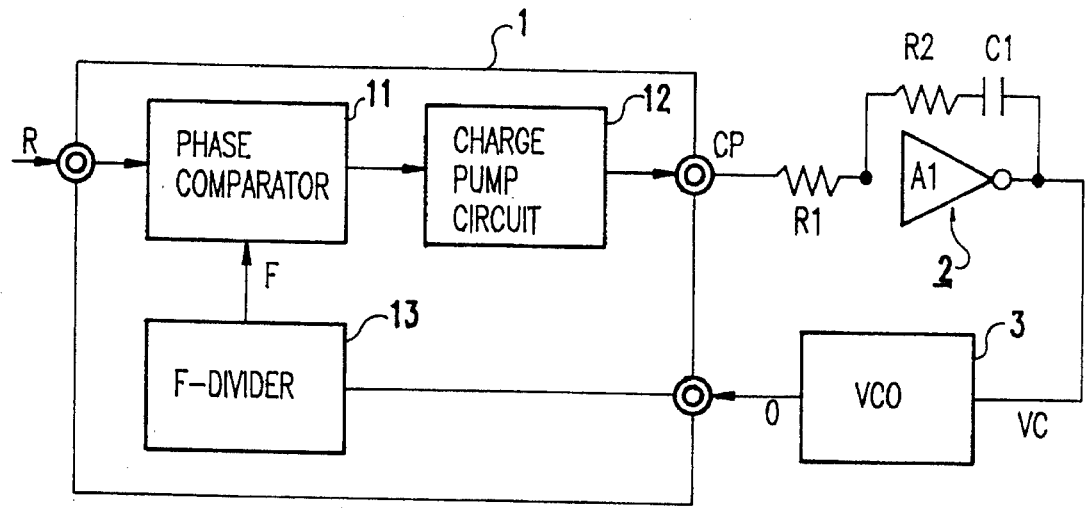
FIG. 6 is a block diagram showing a prior art PLL circuit.
Figure 7:
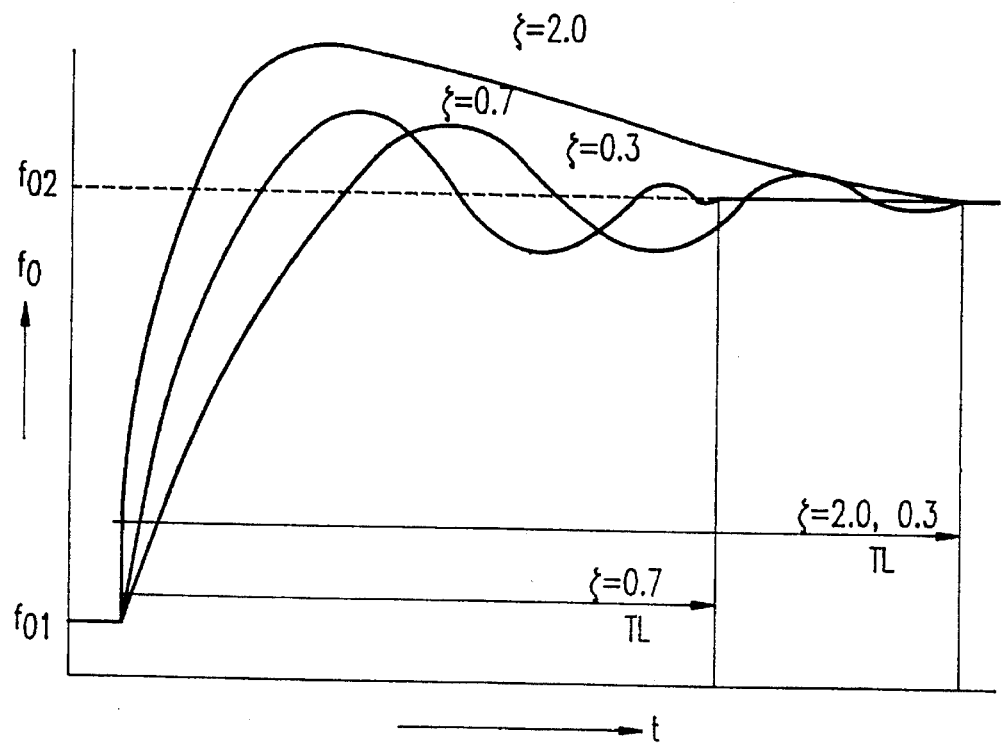
FIG. 7 is a characteristic representation showing an example of the transient response characteristic of the prior art PLL circuit.

Referring to FIG. 1, there is shown a PLL circuit according to a first embodiment of the present invention, in which the same constituents as those shown in FIG. 6 are denoted by the same reference numerals to omit the further description thereof. In the present PLL circuit, a synthesizer unit 1A is fabricated as a monolithic semiconductor integrated circuit device and further includes, in addition to the phase comparator 11, the charge pump circuit 12 and the divider 13, a control unit 17, a switch control circuit 15, four switches S1 to S4, and five resistors R11 to R15. Since one or more resistors of the resistors R11 to R15-operate as an input resistor of the filter circuit 2A, this filter circuit 2A omits the input resistor. It is to be further noted that the phase comparator 11 produces two phase comparison signals U and D, as well known in the art. The signal U indicates an up-command and takes an active low level when the reference signal R advances in phase to the signal F. On the other hand, the signal D indicates a down-command and takes an active low level when the signal F advances in phase to the reference signal R.

The switch control circuit 15 responds to the output signals U and D from the phase comparator 11 and a control signal PS from the controller 11 and produces switching control signals U1 to U4 for controlling the respective switches S1 to S4. Each of the switches S1 to S4 has one end connected to the output of the charge pump circuit 12 and the other end connected to an associated one of the resistors R11 to R14. The control circuit 17 produces a frequency-division ratio data to be set into the divider 13. It is to be noted that the control unit 17 sets the ratio data into the divider 13 via a bus 17-1 while producing the control signal PS of a one-shot pulse.

Figure 2:
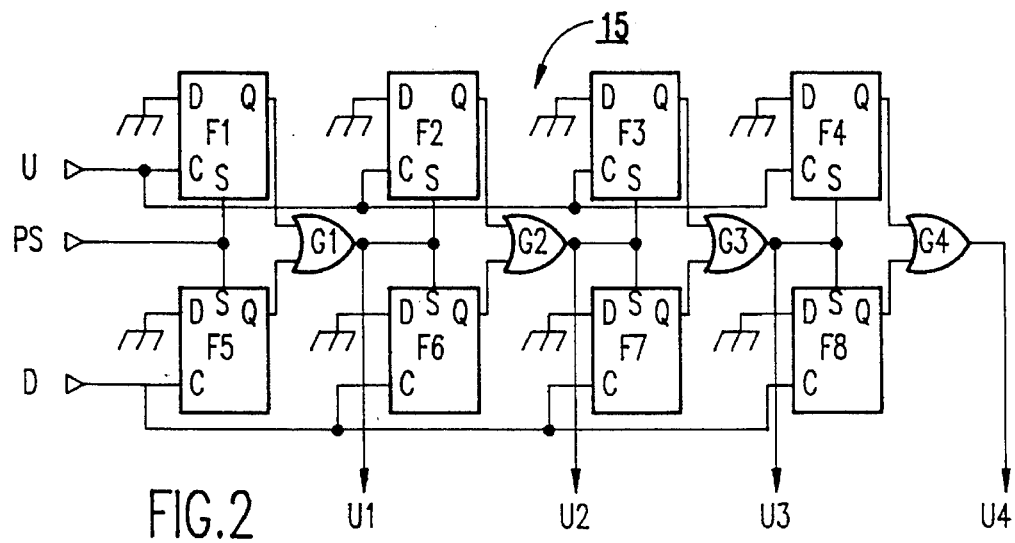
FIG. 2 is a circuit diagram illustrative of a switch control circuit illustrated in FIG. 1.

Referring to FIG. 2, the switch control circuit 15 includes eight D-type flip-flop F1 to F8 each including a set terminal S and four OR gates G1 to G4 which are connected as shown. The respective outputs of the 0R gates G1 to G4 are derived as the respective switching control signals U1 to U4. Each of the flip-flops F1 to F4 holds its output Q at the high level so long as its set terminal S receives the high level and fetches and outputs an input at its data terminal D in response to the falling edge of a clock signal applied to its clock terminal C while the set terminal S is being at the low level.

Figure 4:
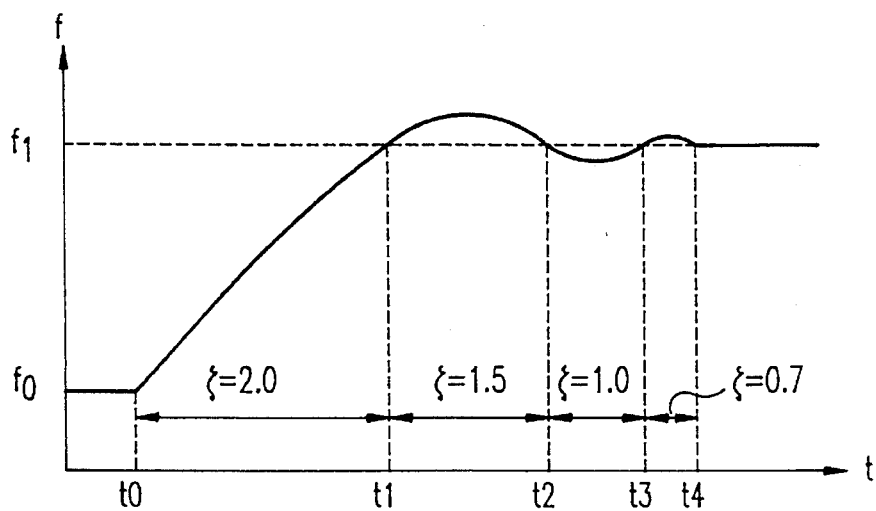
FIG. 4 is a graph illustrative of the transient response characteristic of the PLL circuit shown in FIG. 1.

In operation, assume that the present PLL circuit is in a phase-locked state in which the VCO is producing its output signal 0 having a frequency fo as shown in FIG. 4. Both of the phase comparison signals U and D from the phase comparator 11 are thereby at the highlevel.

Figure 3:
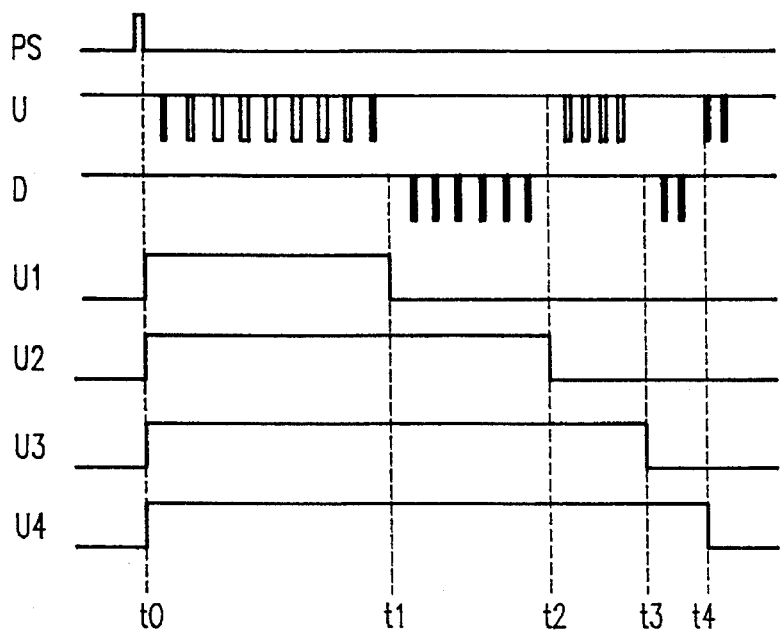
FIG. 3 is a timing chart showing the operation of the switch control circuit illustrated in FIG. 2.

When the control unit 17 is commanded to tune to a new channel that requires the VCO 3 to produce the oscillation signal 0 of a frequency f1, the unit 17 produces and sets new frequency-division ratio data into the divider 13 while producing the control signal PS at a timing to as shown in FIGS. 3 and 4. All the flip-flops F1 to F8 (FIG. 2) thus change the respective output Q to the high level as shown in FIG. 3. Accordingly, all the switching control signals U1 to U4 are changed to the high level, as shown in FIG. 3, to thereby turn all the switches S11 ON. All the resistors R11 to R15 are thus connected in parallel to one another, so that total resistance value thereof becomes a minimum-value r1A.

Since the new division ratio is smaller than the previous one, the phase comparator 11 produces the active low up-command signal U indicative of a difference in phase between each clock of the reference signal R and the corresponding one of the output F of the divider 13, as shown in FIG. 3. At this time, although the flip-flop F1 produces the low level output Q, the flip-flop F5 maintains its output Q at the high level, so that the switching control signal U1 takes the high level. The remaining switching control signals U2 to U4 also assume the high level. Therefore, the charge pump circuit 18 charges the filter 2A through the combined resistors R1 to R5 taking the minimum resistance value r1A. As a result, the oscillation frequency of the VCO is changed toward the frequency f1 at a maximum speed, as shown in FIG. 4.

When the oscillation frequency of the VCO exceeds the frequency f1 at a timing t1 as shown in FIG. 4, the phase comparator 11 then outputs the active low down-command signal D in place of the up-command signal U, as shown in FIG. 3. In response thereto, the flip-flop F5 produces the low level output Q. The switching control signal U1 is thereby changed to the low level to turn the switch OFF. The resistor R11 is thus disconnected from the charge pump circuit 12.

Although the flip-flop F6 also produces the low level output Q, the flip-flop F2 had received the high level at its set terminal S when the first down-command signal D was produced, so that the output Q of the flip-flop F2 has been held at the high level. The remaining switching control signals U2 to U4 maintain the high level, accordingly. The total resistance value is thereby determined by the resistors R12 to R15 and thus becomes higher than the minimum resistance value rA1. The oscillation frequency of the VCO 3 is in turn decreased at speed that is slower than the maximum speed.

Similarly, each time the phase comparator 11 changes its output from a down-command to an up-command and vice versa, the switching control signals S2 to S4 are changed in that order to the low level, as shown in FIG. 3. In other words, the resistance value determined by the resistors R11 to R15 is gradually increased from the minimum value r1A to the maximum value r1D at the respective timings t0 to t4 as shown in FIG. 4.

As described above, the natural angular frequency $\omega n$ and the damping factor $\zeta$ which determine the locking time of the PLL circuit are proportional to the time constant of the filter which is in turn inversely proportional to the square root of the resistance value r1 determined by the resistors R11 to R15 group 17 according to this embodiment.

In the present embodiment, therefore, the damping factor $\zeta$ is changed to 2.0, 1.5, 1.0 and 0.7 at the timings t0, t1, t2 and t3, respectively, as shown in FIG. 4. Accordingly, the locking time from the frequency fo to that f1 is shortened. For instance, the locking time according to the present embodiment is less than 5 mS, whereas the prior art circuit as shown in FIG. 6 requires the locking time of 40 mS. The present PLL circuit is thus greatly advantageous in being used in a cordless telephone system.

Figure 5:
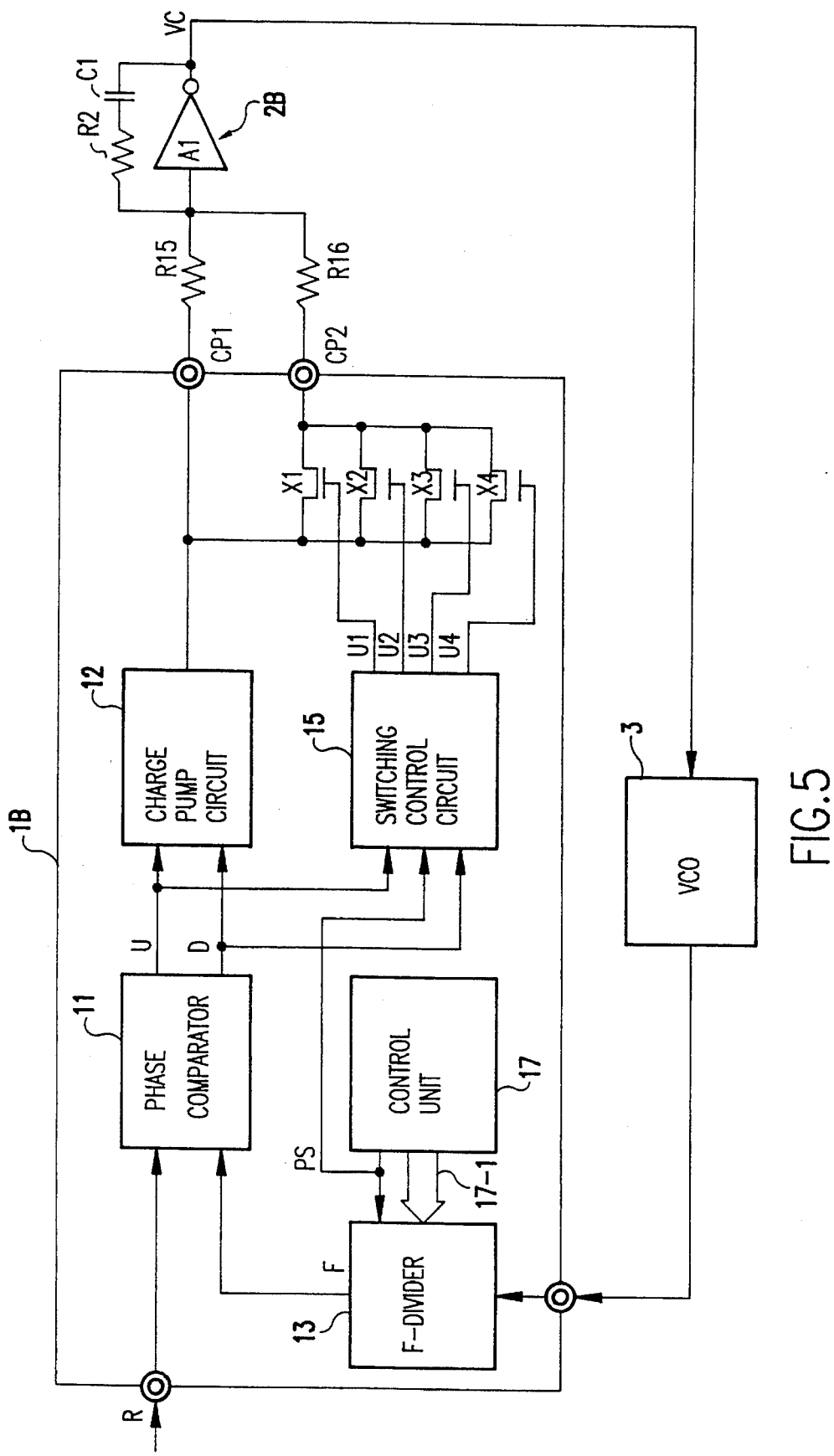
FIG. 5 is a block diagram showing a PLL circuit according to a second embodiment of the present invention.

Referring to FIG. 5, there is shown a PLL circuit according to a second embodiment of the present invention, in which the same constituents as those shown in FIG. 1 are denoted by the same reference numerals to omit the further description thereof.

In this embodiment, the synthesizer IC 1B includes two charge-pump terminals CP1 and CP2 and four transfer gates X1 to X4. The terminal CP1 is directly connected to the output of the charge pump circuit 12, and the transfer gates X1 to X4 are connected in parallel between the output of the circuit 12 and the terminal CP2. Although the transfer gates X1 to X4 are controlled to be on or off by the respective control signals U1 to U4, the conductive resistances thereof are designed to be a certain value.

In this embodiment, further, a filter circuit 2B includes two input resistors R15 and R16 connected respectively to the terminals CP1 and CP2.

Accordingly, when a new frequency-division ratio data is set into the divider 13, all the transfer gates X1 to X4 are turned ON, so that the time constant of the filter becomes a minimum value. Thereafter, the time constant is changed step by step in a manner as described in the first embodiment.

In the embodiment as shown in FIG. 5, since the synthesizer IC 1B requires no resistors, the chip area is made small as compared to that shown in FIG. 1. Moreover, by changing the resistance value of the resistor R15 or R16, a desired change in time constant is obtained suitable for a target system.

It is apparent that the present invention is not limited to the above embodiment but may be changed and modified without departing from the scope and spirit of the invention. For example, the combination of the switch S and the resistors R as shown in FIG. 1 may be replaced by a transfer gate transistor having a desired conductive resistance value. In this connection, the transfer gates X1 to X4 as shown in FIG. 5 may have different conductive resistance values from one another. The resistor R16 may be omitted.

What is claimed is:

1. A phase-locked-loop (PLL) circuit comprising:

a phase comparator for producing a difference signal indicative of a difference in phase between a first signal and a second signal;

an oscillation circuit for producing an oscillation signal from an output of said PLL circuit:

a frequency-division circuit for dividing said oscillation signal by frequency-division ratio data set therein and for producing said second signal; and a switching circuit for causing a damping factor to have a first value in response to a first change of said difference signal caused by changing the frequency-division ratio data of said frequency-division circuit, said switching circuit further for changing said damping factor from said first value to a second value that is smaller than said first value in response to a second change of said output signal of said phase comparator.

2. The phase-locked-loop (PLL) circuit as claimed in claim 1, wherein said first change of said difference signal indicates that one of said first and second signals is phase leading the other of said first and second signals by changing the frequency-division ratio data, and said second change of said output signal indicates that said other of said first and second signals is phase leading said one of said first and second signals.

3. The phase-locked-loop (PLL) circuit as claimed in claim 1, wherein said difference signal of said phase comparator includes a first command signal commanding said oscillation circuit to increase a frequency of said oscillation signal and a second command signal commanding said oscillation circuit to decrease the frequency of said oscillation signal, said first change of said difference signal being indicated by generation of one of said first and second command signals, and said second change of said difference signal being indicated by generation of the other of said first and second command signals.

4. The phase locked loop (PLL) circuit as claimed in claim 1, wherein said switching circuit comprises:

a plurality of pairs of flip-flops, each pair having a common set terminal, each of said flip-flops having a data terminal associated with a preset voltage level, and a clock terminal receiving said difference signal from said phase comparator;

a plurality of dual input OR gates, one corresponding to each of said plurality of pairs of flip-flops, each of said OR gates having input terminals connected to output terminals of said corresponding pair of flip-flops, each of said OR gates further having an output terminal connected to said common set terminal of an adjacent one of said plurality of pairs of flip-flops; and a plurality of switching control lines connected to said output terminals of said plurality of dual input OR gates.

5. The phase locked loop (PLL) circuit as claimed in claim 4, wherein said flip-flops comprise D-type flip flops.

6. A phase-locked-loop (PLL) circuit comprising:

an oscillator for producing an oscillation signal controllable by a control signal;

a frequency divider circuit for dividing in frequency said oscillation signal by division ratio data set therein to produce a feedback signal;

a phase comparator for comparing in phase said feedback signal with a reference signal and for producing a first output signal that assumes an active level when said feedback signal is leading in phase said reference signal; and a second output signal that assumes an active level when said reference signal is leading in phase said feedback signal;

circuit means responsive to said first and second output signals for generating said control signal with a variable damping factor; and control means for controlling said variable damping factor to a first value in response to a change of said division ratio data and to a second value that is smaller than said first value when one of said first and second output signals assumes said active level in place of the other of said first and second output signals assuming said active level.

7. The phase-locked-loop (PLL) circuit as claimed in claim 4, wherein said circuit means comprises:

a resistance circuit connected to said control means for producing first and second control signals supplied to said resistance circuit, said resistance circuit providing a first resistance value to cause said variable damping factor to have said first value in response to said first control signal and a second resistance value to cause said variable damping factor to have said second value in response to said second signal.

8. A phase-locked-loop (PLL) circuit comprising:

an oscillator controlled in oscillation by a control voltage and for producing an oscillation signal;

a frequency divider for dividing in frequency said oscillation signal in response to a frequency-division ratio data stored therein to thereby produce a first signal;

comparator means for receiving said first signal and a second signal and for generating a difference signal indicative of a difference in phase between said first and second signals;

filter means for converting said difference signal into said control voltage, said filter means having a characteristic damping factor associated therewith, said oscillation signal of said oscillator being changed in frequency in response to variation of said frequency division ratio data to be locked from a current frequency to a new frequency after a locking period of time elapses; and control means coupled to said comparator means and said filter means for changing said damping factor of said filter means a plurality of times during said locking period of time to thereby shorten said locking period of time.

9. The phase-locked-loop circuit as claimed in claim 8, wherein said damping factor is made stepwise smaller said plurality of times during said locking period of time.

10. The phase locked loop (PLL) circuit as claimed in claim 8, wherein said control means comprises:

a plurality of pairs of flip-flops, each pair having a common set terminal, each of said flip-flops having a data terminal associated with a preset voltage level, and a clock terminal receiving said difference signal from said phase comparator;

a plurality of dual input OR gates, one corresponding to each of said plurality of pairs of flip-flops, each of said OR gates having input terminals connected to output terminals of said corresponding pair of flip-flops, each of said OR gates further having an output terminal connected to said common set terminal of an adjacent one of said plurality of pairs of flip-flops; and a plurality of switching control lines connected to said output terminals of said plurality of dual input OR gates.

11. The phase locked loop (PLL) circuit as claimed in claim 10, wherein said flip-flops comprise D-type flip flops.

* * * * *